US009755641B1

(12) United States Patent
Bhutta

(10) Patent No.: US 9,755,641 B1
(45) Date of Patent: Sep. 5, 2017

(54) HIGH SPEED HIGH VOLTAGE SWITCHING CIRCUIT

(71) Applicant: Reno Technologies, Inc., Wilmington, DE (US)

(72) Inventor: Imran Ahmed Bhutta, Morrestown, NJ (US)

(73) Assignee: Reno Technologies, Inc.

( * ) Notice: Subject to any disclaimer, the term of this patent is extended or adjusted under 35 U.S.C. 154(b) by 0 days.

(21) Appl. No.: 14/594,275

(22) Filed: Jan. 12, 2015

Related U.S. Application Data

(60) Provisional application No. 62/926,017, filed on Jan. 10, 2014.

(51) Int. Cl.
| | | |
|---|---|---|
| *H03K 19/017* | (2006.01) | |
| *H03K 19/0175* | (2006.01) | |
| *H03K 17/08* | (2006.01) | |
| *H03K 17/12* | (2006.01) | |
| *H03K 17/081* | (2006.01) | |

(52) U.S. Cl.
CPC ........ *H03K 19/017536* (2013.01); *H03K 19/017572* (2013.01); *H03K 17/08* (2013.01); *H03K 17/081* (2013.01); *H03K 17/08116* (2013.01); *H03K 17/12* (2013.01); *H03K 19/017518* (2013.01)

(58) Field of Classification Search
CPC ...... H03K 17/08; H03K 17/081; H03K 17/10; H03K 17/12; H03K 2217/0063
See application file for complete search history.

(56) References Cited

U.S. PATENT DOCUMENTS

| | | | | | |
|---|---|---|---|---|---|
| 3,842,259 | A | * | 10/1974 | Bruning ................ | H03K 17/28 250/214 LS |
| 3,860,754 | A | * | 1/1975 | Johnson ............... | G06F 3/0421 178/18.09 |
| 3,895,241 | A | * | 7/1975 | Cooper ................. | H03K 17/79 250/208.4 |
| 3,987,257 | A | * | 10/1976 | Place ...................... | H04Q 3/00 379/379 |
| 3,996,475 | A | * | 12/1976 | Rodriguez ............ | H03K 17/79 250/214 LS |
| 4,110,700 | A | | 8/1978 | Rosen et al. | |

(Continued)

FOREIGN PATENT DOCUMENTS

| | | |
|---|---|---|
| EP | 0840349 | 5/1998 |
| EP | 0840350 | 5/1998 |
| WO | 2006096589 | 9/2006 |

*Primary Examiner* — Thomas J Hiltunen
(74) *Attorney, Agent, or Firm* — The Belles Group, P.C.

(57) ABSTRACT

A control circuit for an electronic switch includes a first power switch receiving a common input signal and a first voltage input and a second power switch receiving the common input signal and a second voltage input. The first and second power switches switchably connect the first voltage input and the second voltage input, respectively, to a common output in response to the common input signal. The second voltage input is opposite in polarity to the first voltage input, and the first power switch and the second power switch are configured to asynchronously connect the first voltage input and the second voltage input, respectively, to the common output in response to the common input signal, the electronic switch being switched according to the first voltage input or the second voltage input being connected to the common output.

21 Claims, 2 Drawing Sheets

(56) References Cited

U.S. PATENT DOCUMENTS

| | | | |
|---|---|---|---|
| 4,251,742 A * | 2/1981 | Beelitz | H03K 17/666 326/30 |
| 4,679,007 A | 7/1987 | Reese et al. | |
| 4,692,643 A | 9/1987 | Tokunaga et al. | |
| 4,712,020 A * | 12/1987 | Basile | H03K 17/74 250/551 |
| 4,745,610 A * | 5/1988 | Yoshikawa | H01S 5/06825 372/33 |
| 4,751,408 A | 6/1988 | Rambert | |
| 4,857,762 A * | 8/1989 | Gaebel | H03K 19/23 250/551 |
| 4,929,855 A | 5/1990 | Ezzeddine | |
| 5,002,034 A * | 3/1991 | Herden | F02P 7/035 123/643 |
| 5,012,123 A | 4/1991 | Ayasli et al. | |
| 5,079,507 A | 1/1992 | Ishida et al. | |
| 5,645,572 A * | 7/1997 | Kroll | A61N 1/3931 128/901 |
| 5,654,679 A | 8/1997 | Mavretic et al. | |
| 5,815,047 A | 9/1998 | Sorensen et al. | |
| 5,849,136 A | 12/1998 | Mintz et al. | |
| 5,880,921 A | 3/1999 | Tham et al. | |
| 5,889,252 A | 3/1999 | Williams et al. | |
| 5,971,591 A | 10/1999 | Vona et al. | |
| 6,035,235 A * | 3/2000 | Perttu | A61N 1/3956 607/5 |
| 6,046,641 A | 4/2000 | Chawla et al. | |
| 6,137,367 A | 10/2000 | Ezzedine et al. | |
| 6,252,354 B1 | 6/2001 | Collins et al. | |
| 6,353,347 B1 * | 3/2002 | deBrigard | H04M 19/001 327/142 |
| 6,400,012 B1 | 6/2002 | Miller et al. | |
| 6,424,232 B1 | 7/2002 | Mavretic et al. | |
| 6,486,725 B2 * | 11/2002 | Boggs | G06F 11/3636 327/427 |
| 6,583,572 B2 | 6/2003 | Wicker et al. | |
| 6,621,372 B2 | 9/2003 | Kondo et al. | |
| 6,657,395 B2 | 12/2003 | Windhorn | |
| 6,677,828 B1 * | 1/2004 | Harnett | H01J 37/32082 315/111.21 |
| 6,703,080 B2 | 3/2004 | Reyzelman et al. | |
| 6,791,274 B1 | 9/2004 | Hauer et al. | |
| 6,794,951 B2 | 9/2004 | Finley | |
| 6,818,562 B2 | 11/2004 | Todorow et al. | |
| 6,844,779 B2 * | 1/2005 | McEwen | H03F 1/303 250/551 |
| 6,888,313 B2 | 5/2005 | Blackburn et al. | |
| 6,888,396 B2 | 5/2005 | Hajimiri et al. | |
| 6,946,847 B2 | 9/2005 | Nishimori et al. | |
| 6,967,547 B2 | 11/2005 | Pellegrini et al. | |
| 7,004,107 B1 | 2/2006 | Raoux et al. | |
| RE39,051 E | 3/2006 | Harnett | |
| 7,071,786 B2 | 7/2006 | Inoue et al. | |
| 7,095,178 B2 | 8/2006 | Nakano et al. | |
| 7,113,761 B2 | 9/2006 | Bickham et al. | |
| 7,122,965 B2 | 10/2006 | Goodman | |
| 7,164,236 B2 | 1/2007 | Mitrovic et al. | |
| 7,199,678 B2 | 4/2007 | Matsuno | |
| 7,251,121 B2 | 7/2007 | Bhutta | |
| 7,298,091 B2 | 11/2007 | Pickard et al. | |
| 7,298,128 B2 | 11/2007 | Bhutta | |
| 7,304,438 B2 | 12/2007 | Kishinevsky | |
| 7,332,981 B2 | 2/2008 | Matsuno | |
| 7,439,610 B2 | 10/2008 | Weigand | |
| 7,480,571 B2 | 1/2009 | Howald et al. | |
| 7,495,524 B2 | 2/2009 | Omae et al. | |
| 7,498,908 B2 | 3/2009 | Gurov | |
| 7,514,935 B2 | 4/2009 | Pankratz | |
| 7,518,466 B2 | 4/2009 | Sorensen et al. | |
| 7,535,312 B2 | 5/2009 | McKinzie, III | |
| 7,602,127 B2 | 10/2009 | Coumou | |
| 7,642,879 B2 | 1/2010 | Matsuno | |
| 7,666,464 B2 | 2/2010 | Collins et al. | |
| 7,714,676 B2 | 5/2010 | McKinzie, III | |
| 7,728,602 B2 | 6/2010 | Valcore et al. | |
| 7,745,955 B2 | 6/2010 | Kirchmeier et al. | |
| 7,755,300 B2 | 7/2010 | Kishinevsky et al. | |
| 7,764,140 B2 | 7/2010 | Nagarkatti et al. | |
| 7,777,567 B2 | 8/2010 | Polizzo | |
| 7,852,170 B2 | 12/2010 | McKinzie, III | |
| 7,863,996 B2 | 1/2011 | Cotter et al. | |
| 7,868,556 B2 | 1/2011 | Xia | |
| 7,872,523 B2 | 1/2011 | Sivakumar et al. | |
| 7,917,104 B2 | 3/2011 | Manssen et al. | |
| 7,969,096 B2 | 6/2011 | Chen | |
| 8,008,982 B2 | 8/2011 | McKinzie, III | |
| 8,040,068 B2 | 10/2011 | Coumou et al. | |
| RE42,917 E | 11/2011 | Hauer et al. | |
| 8,089,026 B2 | 1/2012 | Sellers | |
| 8,102,954 B2 | 1/2012 | Coumou | |
| 8,110,991 B2 | 2/2012 | Coumou | |
| 8,203,859 B2 | 6/2012 | Omae et al. | |
| 8,217,731 B2 | 7/2012 | McKinzie, III | |
| 8,217,732 B2 | 7/2012 | McKinzie, III | |
| 8,228,112 B2 | 7/2012 | Reynolds | |
| 8,237,501 B2 | 8/2012 | Owen | |
| 8,264,154 B2 | 9/2012 | Banner et al. | |
| 8,278,909 B2 | 10/2012 | Fletcher | |
| 8,289,029 B2 | 10/2012 | Coumou | |
| 8,299,867 B2 | 10/2012 | McKinzie, III | |
| 8,314,561 B2 | 11/2012 | Fisk et al. | |
| 8,330,432 B2 | 12/2012 | Van Zyl et al. | |
| 8,334,657 B2 | 12/2012 | Xia | |
| 8,334,700 B2 | 12/2012 | Coumou et al. | |
| 8,335,479 B2 | 12/2012 | Koya et al. | |
| 8,344,559 B2 | 1/2013 | Van Zyl et al. | |
| 8,344,801 B2 | 1/2013 | Owen et al. | |
| 8,368,308 B2 | 2/2013 | Banna et al. | |
| 8,368,469 B2 | 2/2013 | Mohammadi et al. | |
| 8,395,322 B2 | 3/2013 | Coumou | |
| 8,416,008 B2 | 4/2013 | Van Zyl et al. | |
| 8,436,643 B2 | 5/2013 | Mason | |
| 8,461,842 B2 | 6/2013 | Thuringer et al. | |
| 8,466,736 B1 | 6/2013 | Reynolds | |
| 8,487,706 B2 | 7/2013 | Li et al. | |
| 8,502,689 B2 | 8/2013 | Chen et al. | |
| 8,513,889 B2 | 8/2013 | Zhang et al. | |
| 8,520,413 B2 | 8/2013 | Tran et al. | |
| 8,536,636 B2 | 9/2013 | Englekirk | |
| 8,552,665 B2 | 10/2013 | Larson et al. | |
| 8,558,633 B2 | 10/2013 | McKinzie, III | |
| 8,559,907 B2 | 10/2013 | Burgener et al. | |
| 8,564,381 B2 | 10/2013 | McKinzie | |
| 8,569,842 B2 | 10/2013 | Weis et al. | |
| 8,576,010 B2 | 11/2013 | Yanduru | |
| 8,576,013 B2 | 11/2013 | Coumou | |
| 8,587,321 B2 | 11/2013 | Chen et al. | |
| 8,620,236 B2 | 12/2013 | Manssen et al. | |
| 8,624,501 B2 | 1/2014 | Nagarkatti et al. | |
| 8,633,782 B2 | 1/2014 | Nagarkatti et al. | |
| 8,638,159 B2 | 1/2014 | Ranta et al. | |
| 8,649,754 B2 | 2/2014 | Burgener et al. | |
| 8,659,335 B2 | 2/2014 | Nagarkatti et al. | |
| 8,674,606 B2 | 3/2014 | Carter et al. | |
| 8,680,928 B2 | 3/2014 | Jeon et al. | |
| 8,686,796 B2 | 4/2014 | Presti | |
| 8,710,926 B2 | 4/2014 | Nagarkatti et al. | |
| 8,716,984 B2 | 5/2014 | Mueller et al. | |
| 8,723,423 B2 | 5/2014 | Hoffman et al. | |
| 8,742,669 B2 | 6/2014 | Carter et al. | |
| 8,773,019 B2 | 7/2014 | Coumou et al. | |
| 8,779,859 B2 | 7/2014 | Su et al. | |
| 8,781,415 B1 | 7/2014 | Coumou et al. | |
| 8,815,329 B2 | 8/2014 | Ilic et al. | |
| 8,847,561 B2 | 9/2014 | Karlieek et al. | |
| 8,884,180 B2 | 11/2014 | Ilic et al. | |
| 8,884,525 B2 | 11/2014 | Hoffman et al. | |
| 8,890,537 B2 | 11/2014 | Valcore, Jr. et al. | |
| 8,912,835 B2 | 12/2014 | Nagarkatti et al. | |
| 8,928,329 B2 | 1/2015 | Downing et al. | |
| 9,196,459 B2 * | 11/2015 | Bhutta | H01J 37/32183 |
| 9,341,667 B2 * | 5/2016 | Palmieri | G01R 31/006 |
| 2002/0060914 A1 | 5/2002 | Porter et al. | |

(56) References Cited

U.S. PATENT DOCUMENTS

| | | |
|---|---|---|
| 2002/0180510 A1* | 12/2002 | Tamura .................... H04B 1/48 |
| | | 455/78 |
| 2003/0007372 A1 | 1/2003 | Porter et al. |
| 2003/0046013 A1 | 3/2003 | Gerrish |
| 2006/0091820 A1* | 5/2006 | Jang ................... H05B 41/2828 |
| | | 315/209 R |
| 2006/0170367 A1 | 8/2006 | Bhutta |
| 2006/0198077 A1 | 9/2006 | Bhutta |
| 2006/0232471 A1 | 10/2006 | Coumou |
| 2007/0075784 A1 | 4/2007 | Pettersson et al. |
| 2007/0139122 A1 | 6/2007 | Nagarkatti et al. |
| 2008/0179948 A1 | 7/2008 | Nagarkatti et al. |
| 2008/0180179 A1 | 7/2008 | Polizzo |
| 2008/0197854 A1 | 8/2008 | Valcore et al. |
| 2009/0207537 A1 | 8/2009 | Coumou |
| 2010/0001796 A1 | 1/2010 | Sivakumar et al. |
| 2010/0073104 A1 | 3/2010 | Cotter et al. |
| 2010/0123502 A1 | 5/2010 | Bhutta et al. |
| 2010/0194195 A1 | 8/2010 | Coumou et al. |
| 2010/0201370 A1 | 8/2010 | Coumou et al. |
| 2010/0231296 A1 | 9/2010 | Nagarkatti et al. |
| 2011/0241781 A1 | 10/2011 | Owen et al. |
| 2011/0247696 A1 | 10/2011 | Zolock et al. |
| 2012/0013253 A1 | 1/2012 | Coumou |
| 2012/0062322 A1 | 3/2012 | Owen |
| 2012/0188007 A1 | 7/2012 | Van Zyl et al. |
| 2012/0262064 A1 | 10/2012 | Nagarkatti et al. |
| 2013/0043854 A1 | 2/2013 | Tran et al. |
| 2013/0169359 A1 | 7/2013 | Coumou |
| 2013/0193867 A1 | 8/2013 | Van Zyl et al. |
| 2013/0207738 A1 | 8/2013 | Mason |
| 2013/0222055 A1 | 8/2013 | Coumou et al. |
| 2013/0234779 A1* | 9/2013 | Klug, Jr. .......... H03K 17/04123 |
| | | 327/432 |
| 2013/0257311 A1 | 10/2013 | Tran et al. |
| 2013/0314163 A1 | 11/2013 | Costa |
| 2013/0320853 A1 | 12/2013 | Carter et al. |
| 2014/0009248 A1 | 1/2014 | Granger-Jones |
| 2014/0028389 A1 | 1/2014 | Coumou |
| 2014/0028398 A1 | 1/2014 | Owen |
| 2014/0049250 A1 | 2/2014 | Brown et al. |
| 2014/0055034 A1 | 2/2014 | Coumou |
| 2014/0061156 A1 | 3/2014 | Brouk et al. |
| 2014/0062303 A1 | 3/2014 | Hoffman et al. |
| 2014/0097908 A1 | 4/2014 | Fisk, II et al. |
| 2014/0117861 A1 | 5/2014 | Finley et al. |
| 2014/0117872 A1 | 5/2014 | Finley |
| 2014/0118031 A1 | 5/2014 | Rughoonundon et al. |
| 2014/0210345 A1 | 7/2014 | Hoffman |
| 2014/0210551 A1 | 7/2014 | Mueller |
| 2014/0218076 A1 | 8/2014 | Coumou et al. |
| 2014/0220913 A1 | 8/2014 | Coumou et al. |
| 2014/0231243 A1 | 8/2014 | Finley |
| 2014/0232266 A1 | 8/2014 | Finley et al. |
| 2014/0266492 A1 | 9/2014 | Radomski et al. |
| 2014/0306742 A1 | 10/2014 | Menzer et al. |
| 2014/0320013 A1 | 10/2014 | Coumou et al. |
| 2015/0303033 A1* | 10/2015 | Bhutta ............. H01J 37/32183 |
| | | 315/111.51 |
| 2016/0064161 A1* | 3/2016 | Bhutta .................... H01H 9/54 |
| | | 315/111.21 |
| 2016/0065207 A1* | 3/2016 | Bhutta ................ H03K 17/687 |
| | | 438/10 |
| 2016/0094025 A1* | 3/2016 | Smith ...................... H02H 9/00 |
| | | 323/271 |
| 2016/0134260 A1* | 5/2016 | Bhutta .................. H03H 11/30 |
| | | 333/32 |

\* cited by examiner

HIGH SPEED HIGH VOLTAGE SWITCHING CIRCUIT

CROSS REFERENCE TO RELATED APPLICATIONS

Priority is claimed to U.S. Provisional Application Ser. No. 61/926,017, filed Jan. 10, 2014, the disclosure of which is incorporated herein by reference in its entirety.

FIELD OF THE INVENTION

The field of the present invention relates to electronic circuits which enable high speed switching for high voltage applications, particularly for high voltage RF applications.

BACKGROUND OF THE INVENTION

PiN or NiP diodes are frequently used in RF applications as RF switches. PiN/NiP diodes have the characteristic that their conduction can be changed by applying appropriate bias voltage. When used as a switch, the diode can be turned 'OFF' by applying a reverse bias voltage across it that is of sufficient amplitude to prevent the RF signal from passing through the diode. Similarly, a forward bias can be applied across the diode to turn it 'ON' and make it conduct. The current generated by the forward bias determines the amount of conduction allowed. Since the reverse bias has to be of sufficient amplitude to block an RF signal, the reverse bias voltage is usually a high voltage, whereas the forward bias voltage is a low voltage.

For a typical PiN/NiP diode, the driver circuit for the bias voltage must be able to switch from reverse bias to forward bias in order to turn the PiN/NiP diode 'ON'. There are several methods of driving the PiN/NiP diodes, which generally include the use of mechanical relays, MOSFETs, IGBTs, and the like, to alternatively apply one of the reverse bias and the forward bias to the PiN/NiP diode. For example in a driver circuit that uses MOSFETs, one for each of the reverse bias and the forward bias, the MOSFETs may be switched 'on' or 'off' by applying voltage between their respective gate and source connections. When the high voltage side MOSFET turns 'on', the source connection of this MOSFET needs to go to the high voltage potential. To keep the high voltage side MOSFET turned 'on', the gate of this MOSFET must go to a potential higher than the high voltage potential of the source plus the gate threshold voltage. This condition of maintaining the high voltage MOSFET turned 'on' requires the circuit driving the gate to float above the source, which can be a problem since it necessitates the use of complex circuitry to drive the high voltage side MOSFET.

Gate driver circuits become even more complex when used as part of PiN/NiP diode driver circuitry, in uses when the PiN/NiP diode needs to be turned 'ON' or 'OFF' for a considerable duration. Typically, gate driver circuits are designed for high frequency, high speed switching applications, where the MOSFETs are being switched at frequencies typically in the kHz range. When such circuits are used to drive PiN/NiP diodes, specialized circuitry must be used to enable their use for low frequency switching. For these reasons, PiN/NiP driver circuits are generally complex and expensive, and less complex and expensive PiN/NiP driver circuits are desirable. The same is true for other high voltage switching applications in which high speed switching is desirable alongside low frequency switching.

SUMMARY OF THE INVENTION

The present invention is directed toward a high voltage control circuit for an electronic switch, the control circuit being able to switch between a high voltage source and a low voltage source on a common output at high speed to control the state of the electronic switch.

In a first separate aspect of the present invention, a control circuit for an electronic switch includes a first power switch receiving a common input signal and a first voltage input and configured to switchably connect the first voltage input to a common output in response to the common input signal; and a second power switch receiving the common input signal and a second voltage input and configured to switchably connect the second voltage input to the common output in response to the common input signal, wherein the second voltage input is opposite in polarity to the first voltage input, and the first power switch and the second power switch are configured to asynchronously connect the first voltage input and the second voltage input, respectively, to the common output in response to the common input signal, the electronic switch being switched according to the first voltage input or the second voltage input being connected to the common output.

In a second separate aspect of the present invention, a method of controlling an electronic switch includes: directing a first voltage input into a first power switch; directing a second voltage input into a second power switch; directing a common input signal into the first power switch and into the second power switch; and controlling the first power switch and the second power switch with the common input signal, wherein the first power switch connects the first voltage input to a common output in response to the common input signal, and the second power switch asynchronously connects, with respect to the first voltage input, the second voltage input to the common output in response to the common input signal, and wherein the electronic switch, which is electronically coupled to the common output, is switched according to the first voltage input or the second voltage input being connected to the common output.

Accordingly, an improved high voltage control circuit for an electronic switch is disclosed. Advantages of the improvements will be apparent from the drawings and the description of the preferred embodiment.

BRIEF DESCRIPTION OF THE DRAWINGS

The foregoing summary, as well as the following detailed description of the exemplary embodiments, will be better understood when read in conjunction with the appended drawings. It should be understood, however, that the invention is not limited to the precise arrangements and instrumentalities shown in the following figures.

DETAILED DESCRIPTION OF THE INVENTION

The description of illustrative embodiments according to principles of the present invention is intended to be read in connection with the accompanying drawings, which are to be considered part of the entire written description. In the description of embodiments of the invention disclosed herein, where circuits are shown and described, one of skill in the art will recognize that for the sake of clarity, not all desirable or useful peripheral circuits and/or components are shown in the figures or described in the description. Moreover, the features and benefits of the invention are illustrated by reference to the disclosed embodiments. Accordingly, the invention expressly should not be limited to such disclosed embodiments illustrating some possible non-limiting combinations of features that may exist alone or in other combinations of features; the scope of the invention being defined by the claims appended hereto.

Figure 1:
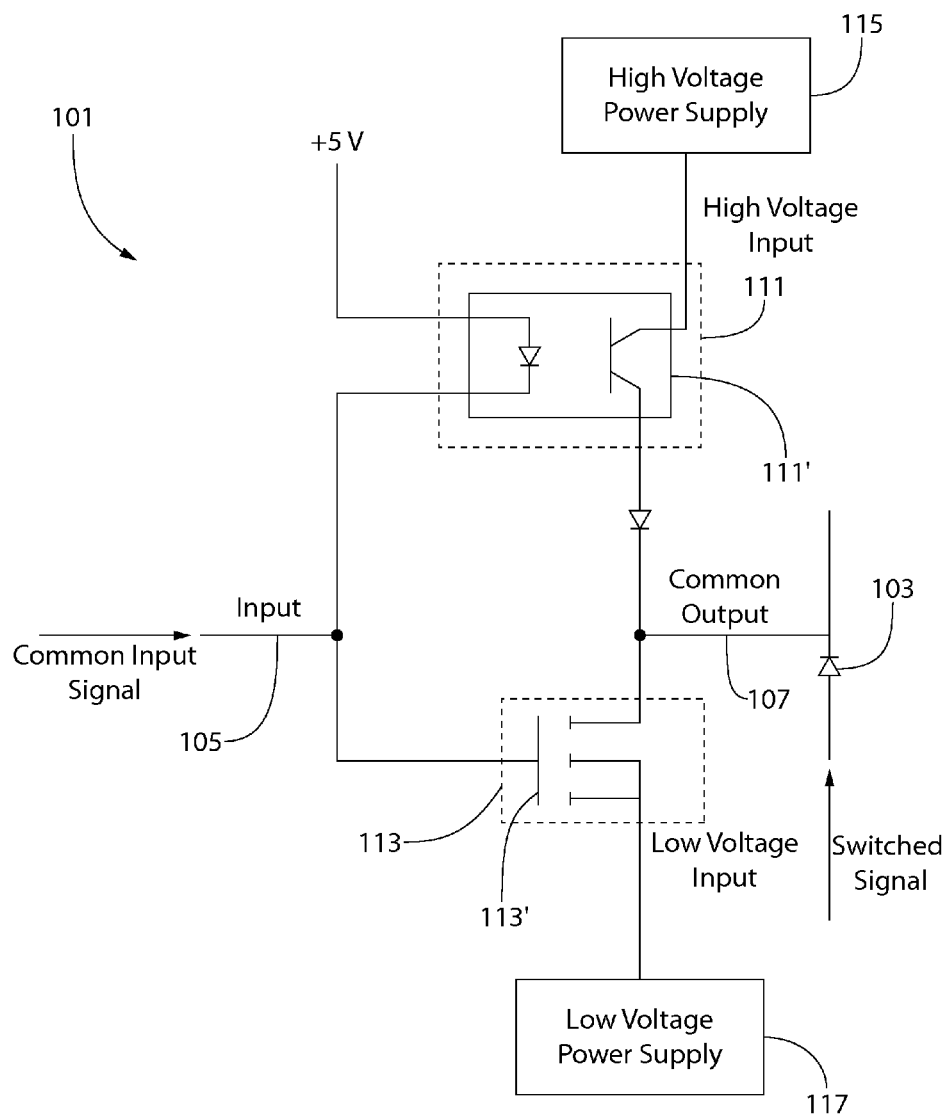
FIG. 1 is a first exemplary embodiment of a high voltage control circuit shown in conjunction with power supplies a PiN/NiP diode as an exemplary electronic switch.

Turning in detail to the drawings, FIG. 1 shows an embodiment of a high voltage control circuit 101 driving a PiN/NiP diode 103 as an electronic switch. One of skill in the art will recognize that the use of the PiN/NiP diode 103 in this embodiment is exemplary, and that the control circuit 101 may be coupled to other types of circuitry that does not include a PiN/NiP diode. One of skill in the art will also recognize that certain components of the control circuit 101 may be replaced with other components that perform the same essential function while also greater allowing variability in other circuit parameters (e.g. voltage range, current range, and the like).

This control circuit 101 has an input 105 which receives a common input signal for controlling the voltage on the common output 107 of the control circuit 101. In the embodiment depicted, the common output 107 is connected to the PiN/NiP diode 103, and the voltage on the common output 107 switches the PiN/NiP diode 103 between the 'ON' state and the 'OFF' state. The input 105 is connected to both a first power switch 111 and into a second power switch 113. As depicted, the first power switch 111 is an optocoupler phototransistor 111', and the second power switch 113 is a MOSFET 113'. A high voltage power supply 115 is connected to the first power switch 111, providing a high voltage input which is to be switchably connected to the common output 107. A low voltage power supply 117 is connected to the second power switch 113, providing a low voltage input which is also to be switchably connected to the common output 107. In the configuration of the control circuit 101 shown, the low voltage power supply 117 may supply a low voltage input which is about −5 V. Such a low voltage, with a negative polarity, is sufficient to provide a forward bias for switching the PiN/NiP diode 103. For other configurations of the control circuit 101, a higher or lower voltage input may be used, and the low voltage input may have a positive polarity, depending upon the configuration and the type of electronic switch being controlled.

The common input signal asynchronously controls the 'on' and 'off' states of the first power switch 111 and the second power switch 113, such that when the first power switch 111 is in the 'on' state, the second power switch 113 is in the 'off' state, and similarly, when the first power switch is in the 'off' state, the second power switch 113 is in the 'on' state. In this manner, the common input signal controls the first power switch 111 and the second power switch 113 to asynchronously connect the high voltage input and the low voltage input to the common output for purposes of switching the PiN/NiP diode 103 between the 'ON' state and the 'OFF' state.

The input 105 may be configured to receive any type of appropriate control signal for the types of switches selected for the first power switch 111 and the second power switch 113, which may be, for example, a +5 V control signal. Of course, to maintain simplicity of the overall control circuit 101 and avoid incurring additional manufacturing costs, the first and second power switches 111, 113 are preferably selected so that they may directly receive the common input signal without requiring additional circuitry to filter or otherwise transform the common input signal.

The control circuit 101 has design features which make it particularly useful for switching between a high voltage input and a low voltage input on the common output quickly and without the need to float the drive circuit, with respect to the high voltage input, or require use of special gate charging circuits due to isolation of the input signal from the high voltage input. Another advantage of the control circuit 101 is that it provides the ability to switch the common output between voltage modes quickly, within the time frame of about 15 μsec or less. The simplicity of the control circuit 101 should considerably reduce manufacturing costs, especially when compared to other circuits performing similar functionality, and it should also significantly reduce space requirements for the circuit, and again, especially as compared to other circuits performing similar functionality.

One of the ways in which these advances are realized is the first power switch 111 being a monolithic circuit element, such as the optocoupler phototransistor 111'. A monolithic element reduces both cost and space requirements. When an optocoupler phototransistor 111' is used as the monolithic element, it can perform the necessary high voltage switching quickly, and it serves to isolate the high voltage input from the common input signal. Other, as yet unrealized advantages may also be present through the use of an optocoupler phototransistor 111'.

An optocoupler phototransistor 111' serves well as the first power switch 111 in uses with PiN/NiP diodes because of the low current requirements for a PiN/NiP diode when in the 'OFF' state. During the 'OFF' state, a PiN/NiP diode is reverse biased, and thus non-conducting, and as such the 'OFF' state current requirement falls within the current handling capability of most optocoupler phototransistors. In addition, in implementations when one or both of the voltage requirements or the current requirements exceed the specifications for a single optocoupler phototransistor, additional optocoupler phototransistors may be added into the circuit in series or in parallel to increase the voltage and/or current handling capabilities of the control circuit 101.

To further highlight the advantages of the control circuit 101, its operation is detailed when the first power switch 111 is an optocoupler phototransistor 111' and the second power switch 113 is an appropriate MOSFET 113'. In this example, the common input signal may be a ±5 V control signal which is alternated between a first voltage level and a second voltage level that serve to switch both the optocoupler phototransistor 111' and the MOSFET 113' between 'on' and 'off' states. The manner of implementing a ±5 V control signal is well known to those of skill in the art.

When the PiN/NiP diode 103 is to be turned to the 'OFF' state, the optocoupler phototransistor 111' is turned to the 'on' state by applying the first voltage level from the common input signal across the photodiode inputs of the optocoupler phototransistor 111'. Turning the optocoupler phototransistor 111' to the 'on' state connects high voltage input to the common output 107, thereby reverse biasing the PiN/NiP diode 103. At the same time, during this 'OFF' state of the PiN/NiP diode, application of the first voltage level from the common input signal to the MOSFET 113' places the MOSFET 113' in the 'off' state, thereby disconnecting low voltage input from the common output 107.

When the PiN/NiP diode 103 is to be turned to the 'ON' state, the optocoupler phototransistor 111' is turned to the 'off' state by applying the second voltage level from the common input signal across the photodiode inputs of the optocoupler phototransistor 111'. Turning the optocoupler phototransistor 111' to the 'off' state disconnects high voltage input from the common output 107. At the same time, application of the second voltage level from the common input signal to the MOSFET 113' places the MOSFET 113' in the 'on' state, thereby connecting the low voltage input to the common output 107. With the MOSFET 113' in the 'on' state, and the optocoupler phototransistor 111' to the 'off' state, only the low voltage input is connected to the common output 107, so that the PiN/NiP diode 103 is forward biased and placed in the 'ON' state.

As indicated above, the optocoupler phototransistor 111' provides the advantage that the common input signal is electrically isolated, through the internal optical switch (not shown) of the optocoupler phototransistor 111', from the switched high voltage, thus alleviating the need to float the drive circuit (such as when a MOSFET is used to switch the high voltage). Use of the optocoupler phototransistor 111' provides the additional advantage that the control circuit 101 can quickly switch the common output 107 between the high voltage input and the low voltage input, with the switching occurring within the time frame of about 15 μsec or less. This fast switching time helps reduce switching loss, thereby reducing stress on the PiN/NiP diode itself.

The use of optocoupler phototransistors in the control circuit 101 also provides advantages for switching a high voltage input of 500 V-1000 V, and higher. The high voltage input may therefore differ from the low voltage input by at least two or three orders of magnitude, or more. Advantageously, when the control circuit 101 is used to switch a PiN/NiP diode, the high voltage input and the low voltage input may have opposite polarities.

Figure 2:
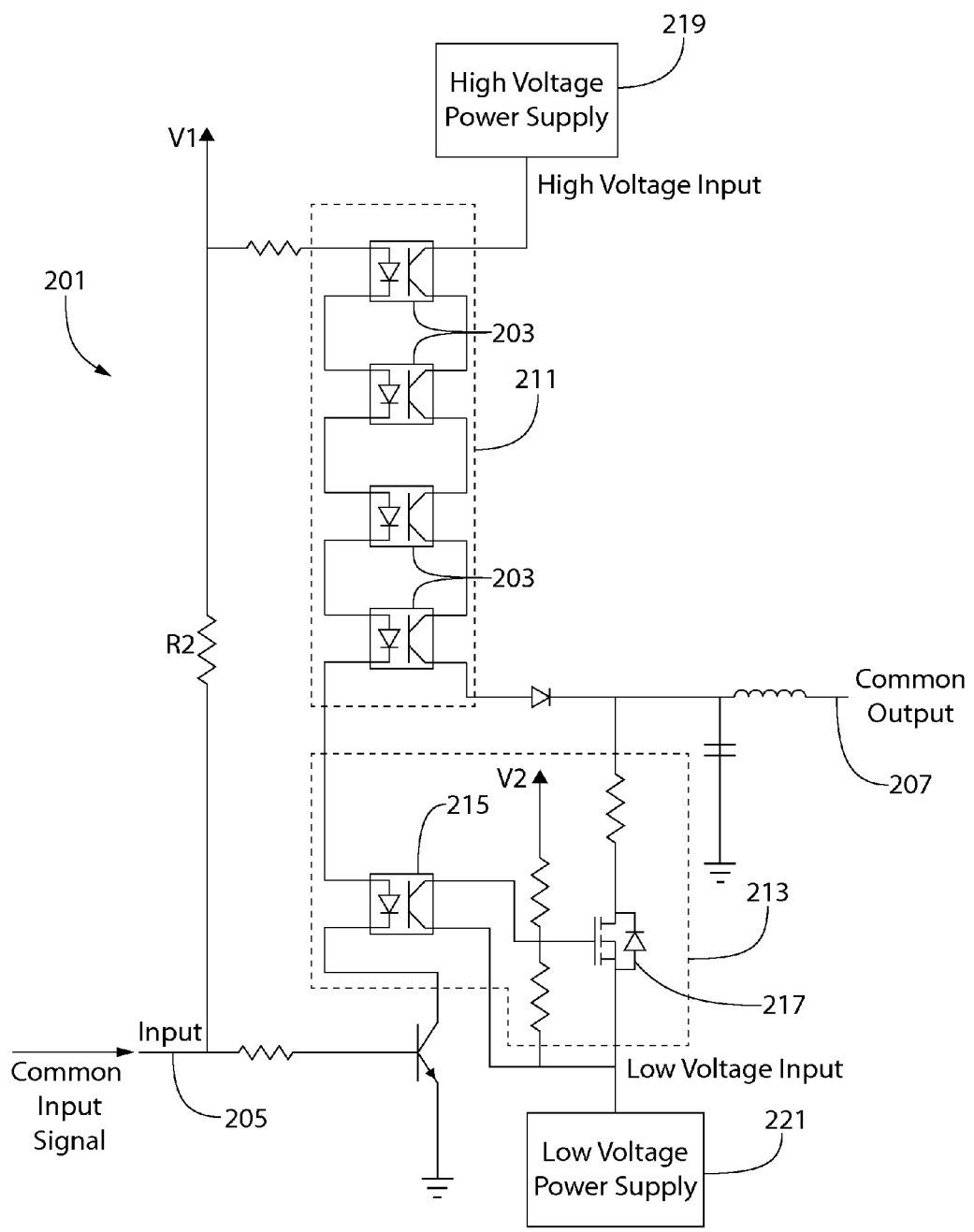
FIG. 2 is a second exemplary embodiment of a high voltage control circuit.

A control circuit 201 which utilizes multiple optocoupler phototransistors 203 to increase the high voltage capabilities is shown in FIG. 2. Like the control circuit 101 of FIG. 1, this control circuit 201 includes an input 205 which receives a common input signal for controlling the voltage on the common output 207 of the control circuit 201. The common output 207 is connected to an electronic switch (not shown), such as, e.g., a PiN/NiP diode, and the voltage on the common output 207 may be used to switch the electronic switch between 'ON' state and 'OFF' states. The input 205 is connected to both a first power switch 211, which includes the optocoupler phototransistors 203, and to a second power switch 213, which includes another optocoupler phototransistor 215 and a MOSFET 217.

A high voltage power supply 219 is connected to the first power switch 211, providing a high voltage input which is to be switchably connected to the common output 207. A low voltage power supply 221 is connected to the second power switch 213, providing a low voltage input which is also to be switchably connected to the common output 207.

The optocoupler phototransistors 203 of the first power switch 211 are connected in series to each other in order to enable the first power switch 211 to switch higher voltages. With appropriate selection of the optocoupler phototransistors 203, the first power switch 211, as shown, is capable of switching about 1000 V or more from the high voltage power supply 219 to the common output 207. Additional optocoupler phototransistors may be added in series for the first power switch 211 to increase the high voltage switching capabilities. One of skill in the art will recognize that one or more optocoupler phototransistors may connected in parallel to each other to increase the current load capabilities of the first power switch 211.

The optocoupler phototransistor 215 of the second power switch 213 receives the common input signal, like the optocoupler phototransistors 203 of the first power switch 211. This optocoupler phototransistor 215 is connected to the MOSFET 217 and places the MOSFET 217 in the 'off' state by connecting the source to the gate when the common input signal places the first power switch 211 in the 'on' state. In this configuration, when the MOSFET 217 is in the 'on' state, the second power switch 213 is also in the 'on' state, connecting the low power input to the common output 207. Likewise, when the MOSFET 217 is in the 'off' state, the second power switch 213 is also in the 'off' state, so that the low power input is disconnected from the common output 207. When the first power switch is in the 'off' state, optocoupler phototransistor 215 disconnects the gate from the source, so that the MOSFET 217 placed in the 'on' state by the gate being connected to the voltage V2, which is an appropriate voltage for controlling the gate of the MOSFET 217.

While the invention has been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present invention. Thus, the spirit and scope of the invention should be construed broadly as set forth in the appended claims.

What is claimed is:

1. A circuit for switching a diode, the circuit comprising:
    a diode, the diode being a PiN diode or an NiP diode;
    a first power switch receiving a common input signal and a first voltage and configured to switchably provide the first voltage to a common output in response to the common input signal, the first power switch comprising a plurality of optocoupler phototransistors connected in series;
    a second power switch receiving the common input signal and a second voltage and configured to switchably connect the second voltage to the common output in response to the common input signal, wherein:
    the second voltage is opposite in polarity to the first voltage;
    the first power switch and the second power switch are configured to asynchronously provide the first voltage and the second voltage, respectively, to the common output in response to the common input signal, the diode being switched according to the first voltage or the second voltage being connected to the common output; and
    when the plurality of optocoupler phototransistors of the first power switch are switched off, a voltage drop from the first voltage to the second voltage occurs across the plurality of optocoupler phototransistors.

2. The circuit of claim 1, wherein the first voltage differs from the second voltage by at least two orders of magnitude.

3. The circuit of claim 1, wherein the first voltage is greater than 500 volts.

4. The circuit of claim 1, wherein the first voltage differs from the second voltage by at least three of magnitude.

5. The circuit of claim 1, wherein the first power switch electrically isolates the common input signal from the first voltage.

6. The circuit of claim 1, wherein the common input signal is a 5 volt control signal.

7. The circuit of claim 1, wherein the first power switch and the second power switch, in combination, are configured to switch between the first voltage and the second voltage on the common output in about 15 μsec or less.

8. A circuit for switching a diode, the circuit comprising:
a diode;
a first power switch receiving a common input signal and a first voltage and configured to switchably provide the first voltage to a common output in response to the common input signal, the first power switch comprising a plurality of optocoupler phototransistors connected in series;
a second power switch receiving the common input signal and a second voltage and configured to switchably connect the second voltage to the common output in response to the common input signal, wherein:
the first power switch and the second power switch are configured to asynchronously provide the first voltage and the second voltage, respectively, to the common output in response to the common input signal, the diode being switched according to the first voltage or the second voltage being connected to the common output; and
when the plurality of optocoupler phototransistors of the first power switch are switched off, a voltage drop from the first voltage to the second voltage occurs across the plurality of optocoupler phototransistors.

9. The circuit of claim 8, wherein the first voltage is greater than 1000 volts.

10. The circuit of claim 8, wherein the first voltage differs from the second voltage by at least two orders of magnitude.

11. The circuit of claim 8, wherein the first power switch electrically isolates the common input signal from the first voltage.

12. The circuit of claim 8, wherein the common input signal is a 5 volt control signal.

13. The circuit of claim 8, wherein the first power switch and the second power switch, in combination, are configured to switch between the first voltage and the second voltage on the common output in about 15 μsec or less.

14. A method of switching a diode, the method comprising:

providing a first voltage to a first power switch, the first power switch comprising a plurality of optocoupler phototransistors connected in series;
providing a second voltage to a second power switch;
providing a common input signal to the first power switch and to the second power switch; and
controlling the first power switch and the second power switch with the common input signal, wherein the first power switch provides the first voltage to a common output in response to the common input signal, and the second power switch asynchronously provides, with respect to the first voltage, the second voltage to the common output in response to the common input signal, and wherein the diode, which is electronically coupled to the common output, is switched according to the first voltage or the second voltage being provided to the common output;
wherein when the plurality of optocoupler phototransistors of the first power switch are switched off, a voltage drop from the first voltage to the second voltage occurs across the plurality of optocoupler phototransistors.

15. The method of claim 14, wherein the second voltage is opposite in polarity to the first voltage.

16. The method of claim 15, wherein the first voltage is greater than 500 volts.

17. The method of claim 14, wherein the first voltage differs from the second voltage by at least two orders of magnitude.

18. The method of claim 14, wherein the first voltage differs from the second voltage by at least three orders of magnitude.

19. The method of claim 14, wherein the first power switch electrically isolates the common input signal from the first voltage.

20. The method of claim 14, wherein the common input signal is a 5 volt control signal.

21. The method of claim 14, wherein the first power switch and the second power switch, in combination, are configured to switch between the first voltage and the second voltage on the common output in about 15 μsec or less.

* * * * *